(12) United States Patent
Cheng et al.

(10) Patent No.: US 9,704,856 B1
(45) Date of Patent: Jul. 11, 2017

(54) ON-CHIP MIM CAPACITOR

(71) Applicant: INTERNATIONAL BUSINESS MACHINES CORPORATION, Armonk, NY (US)

(72) Inventors: Kangguo Cheng, Schenectady, NY (US); Peng Xu, Guilderland, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/274,621

(22) Filed: Sep. 23, 2016

(51) Int. Cl.
| | |
|---|---|
| *H01L 21/00* | (2006.01) |
| *H01L 27/06* | (2006.01) |
| *H01L 21/3213* | (2006.01) |
| *H01L 21/8238* | (2006.01) |
| *H01L 29/66* | (2006.01) |
| *H01L 49/02* | (2006.01) |
| *H01L 21/3105* | (2006.01) |
| *H01L 27/092* | (2006.01) |

(52) U.S. Cl.
CPC .... *H01L 27/0629* (2013.01); *H01L 21/31051* (2013.01); *H01L 21/32133* (2013.01); *H01L 21/32139* (2013.01); *H01L 21/823821* (2013.01); *H01L 21/823828* (2013.01); *H01L 21/823864* (2013.01); *H01L 21/823871* (2013.01); *H01L 27/0924* (2013.01); *H01L 28/40* (2013.01); *H01L 29/66545* (2013.01)

(58) Field of Classification Search
CPC . H01L 29/945; H01L 21/84; H01L 21/31051; H01L 27/10867; H01L 27/1203; H01L 27/10873; H01L 27/0629
See application file for complete search history.

(56) References Cited

U.S. PATENT DOCUMENTS

| | | |
|---|---|---|
| 6,387,775 B1 | 5/2002 | Jang et al. |
| 6,461,914 B1 | 10/2002 | Roberts et al. |
| 6,947,275 B1 | 9/2005 | Anderson et al. |
| 6,995,412 B2 | 2/2006 | Fried et al. |
| 7,851,861 B2 | 12/2010 | Tu |
| 8,420,476 B2 | 4/2013 | Booth, Jr. et al. |
| 8,513,723 B2 | 8/2013 | Booth, Jr. et al. |
| 8,581,320 B1 | 11/2013 | Cheng et al. |
| 9,245,884 B1 | 1/2016 | Erickson et al. |
| 2007/0004224 A1* | 1/2007 | Currie .............. H01L 21/3141 438/778 |
| 2008/0173978 A1 | 7/2008 | Tu |

(Continued)

*Primary Examiner* — Zandra Smith
*Assistant Examiner* — John M Parker
(74) *Attorney, Agent, or Firm* — Tutunjian & Bitetto, P.C.; Vazken Alexanian

(57) ABSTRACT

A method for forming an on-chip capacitor with complementary metal oxide semiconductor (CMOS) devices includes forming a first capacitor electrode between gate structures in a capacitor region while forming contacts to source and drain (S/D) regions in a CMOS region. Gate structures are cut in the CMOS region and the capacitor region by etching a trench across the gate structures and filling the trench with a dielectric material. The gate structures and the dielectric material in the trench in the capacitor region are removed to form a position for an insulator and a second electrode. The insulator is deposited in the position. Gate metal is deposited to form gate conductors in the CMOS region and the second electrode in the capacitor region.

16 Claims, 11 Drawing Sheets

(56) References Cited

U.S. PATENT DOCUMENTS

2009/0101956 A1\* 4/2009 Booth, Jr. ............ H01L 27/1087
257/301
2011/0298025 A1 12/2011 Haensch et al.
2014/0042547 A1 2/2014 Khakifirooz et al.

\* cited by examiner

US 9,704,856 B1

ON-CHIP MIM CAPACITOR

BACKGROUND

Technical Field

The present invention generally relates to semiconductor devices, and more particularly to complementary metal oxide semiconductor (CMOS) devices and fabrication methods with capacitor fabrication integrated into the process.

Description of the Related Art

Complementary metal oxide semiconductor (CMOS) devices are continuously scaling down their size and device pitch. Gate pitch is also reduced in keeping with the decreasing scale. To accommodate the small gate pitch, patterning processes, such as, self-aligned double patterning (SADP) have been employed to provide the tight gate pitch patterning dimensions. However, the integration of capacitors and other peripheral devices cannot be easily integrated with the tight gate pitch employed for current CMOS devices.

SUMMARY

In accordance with an embodiment of the present invention, a method for forming an on-chip capacitor with complementary metal oxide semiconductor (CMOS) devices includes forming a first capacitor electrode between gate structures in a capacitor region while forming contacts to source and drain (S/D) regions in a CMOS region. Gate structures are cut in the CMOS region and the capacitor region by etching a trench across the gate structures and filling the trench with a dielectric material. The gate structures and the dielectric material in the trench in the capacitor region are removed to form a position for an insulator and a second electrode. The insulator is deposited in the position. Gate metal is deposited to form gate conductors in the CMOS region and the second electrode in the capacitor region.

Another method for forming an on-chip capacitor with complementary metal oxide semiconductor (CMOS) devices includes patterning gate structures over source and drain (S/D) regions in a CMOS region and over a substrate in a capacitor region; planarizing an interlevel dielectric layer in the CMOS region and the capacitor region; depositing and planarizing contacts in contact holes to the S/D regions in the CMOS regions and between the gate structures in the capacitor region to form first electrode; cutting the gate structures in the CMOS region and the capacitor region by etching at least one trench across the gate structures and filling the at least one trench with a dielectric material; removing the gate structures and the dielectric material in the at least one trench in the capacitor region to form a position for an insulator and a second electrode; depositing the insulator in the position; and depositing gate metal to form gate conductors in the CMOS region and the second electrode in the capacitor region.

A device having an on-chip capacitor with complementary metal oxide semiconductor (CMOS) devices includes a first capacitor electrode formed between gate structure regions in a capacitor region and formed from contact metal for contacts to source and drain (S/D) regions in a CMOS region. A gate cut trench structure is formed in the capacitor region and filled with a conductive material and connected to the first capacitor electrode. An insulator spacer is formed in contact with the first electrode in the gate structure regions in the capacitor region. A second electrode is formed in contact with the insulator within the gate structure regions in the capacitor region to form the on-chip capacitor.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Figure 1:
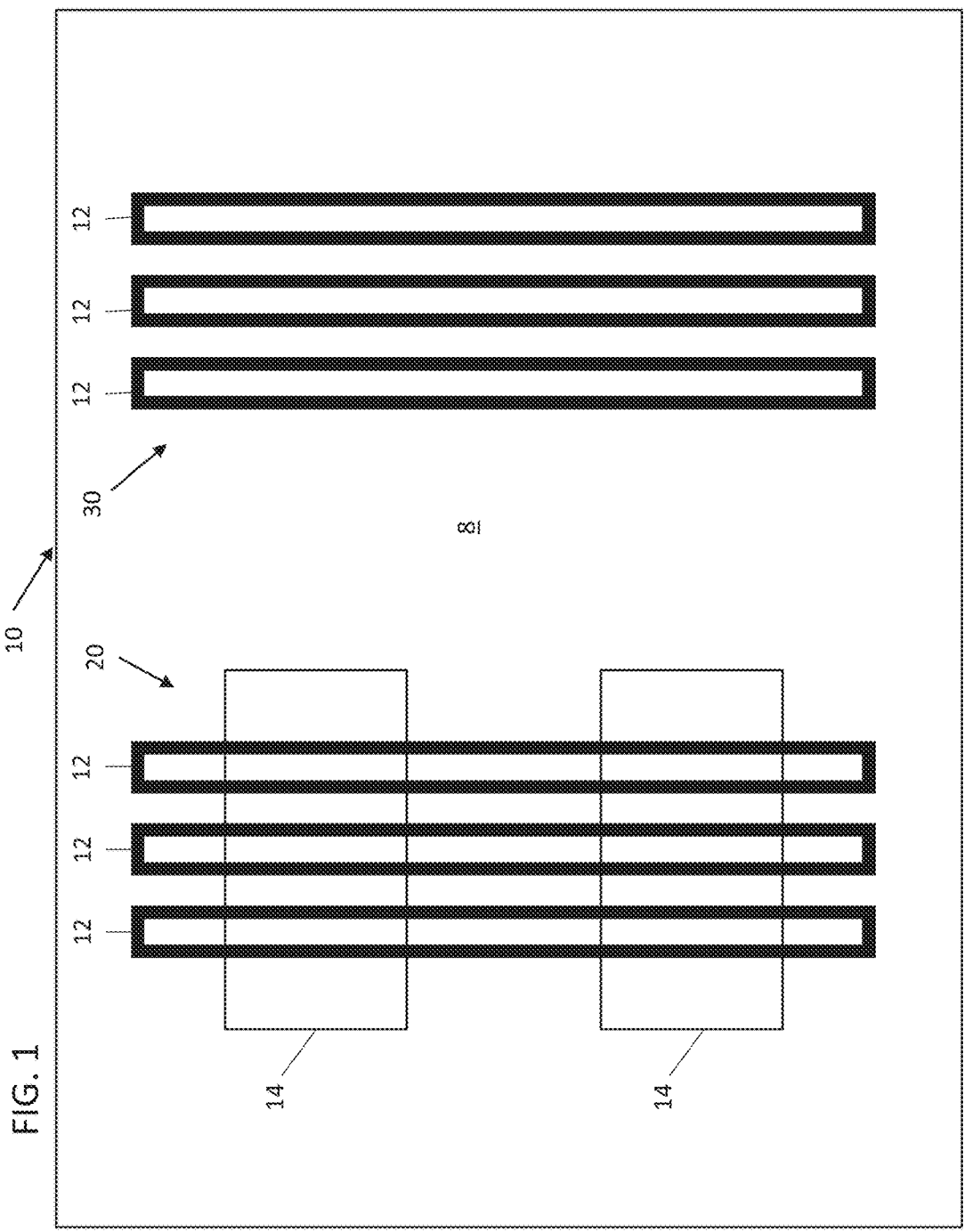
FIG. 1 is a top view showing a device having a complementary metal oxide semiconductor (CMOS) region and a capacitor region having gates formed in accordance with an embodiment of the present invention.

In accordance with embodiments of the present invention, methods and structures are provided for forming on-chip capacitors. On-chip capacitors or metal-insulator-metal (MIM) devices are needed in many applications such as for system-on-chip (SOC) applications, memory devices, processors, etc.

The present embodiments provide fabrication methods and structures that integrate the formation of an on-chip capacitor with complementary metal oxide semiconductor (CMOS) processing steps. In one embodiment, gate metal is employed for forming one capacitor electrode, and a contact metal is employed for forming another capacitor electrode. A capacitor dielectric or insulator is formed between the electrodes. The insulator may be formed as a spacer or be concurrently formed with gate dielectric formation (for CMOS devices) or a combination of both.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, components and/or groups thereof.

Spatially relative terms, such as "beneath," "below", "lower," "above," "upper," and the like, can be used herein for ease of description to describe one element's or feature's ship to another element(s) or feature(s) as illustrated in the FIGS. It will be understood that the spatially relative terms are intended to encompass different orientations of the device in use or operation in addition to the orientation depicted in the FIGS. For ample, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Referring now to the drawings in which like numerals represent the same or similar elements and initially to FIG. 1, a top view of a partially fabricated semiconductor device 10 is shown in accordance with present embodiments. The device 10 can include any type of semiconductor device including memory, processor, hybrid device, system-on-chip, three dimensional device, etc. The device 10 is divided into regions 20, 30. In region 20, complementary metal oxide semiconductor (CMOS) devices can be formed. The CMOS devices can include fin field effect transistor (Fin-FETs), planar FETs and/or other types of FET structures. A substrate 8 is represented by the plane of the page of FIG. 1. The substrate 8 can include a bulk semiconductor substrate, which may be a silicon-based material. Illustrative examples of Si-based materials suitable for the bulk semiconductor substrate 8 include, but are not limited to monocrystalline forms of Si, SiGe, SiGeC, SiC and multi-layers thereof. The semiconductor substrate 8 may also be a silicon on insulator (SOI) or semiconductor on insulator (SeOI) substrate where substrate includes a base semiconductor layer and substrate 8 as depicted actually forms the semiconductor (or SOI) layer on top of a buried dielectric layer (not shown).

Each of the semiconductor base layer and/or the SOI layer of the substrate 8 can also include a semiconductor material independently selected from elemental semiconductor materials (e.g., silicon, germanium, carbon, or alloys thereof), III-V semiconductor materials, or II-VI semiconductor materials, etc. Each semiconductor material for the semiconductor base layer and the SOI layer of substrate 8 can be independently single crystalline, polycrystalline, or amorphous. In some embodiments, the SOI layer may include a same or different semiconductor material as that of the semiconductor base layer.

Within substrate 8, an active channel region(s) 14 is formed by doping the substrate 8. In one embodiment, when forming regions 14 having a p-type conductivity, a dopant species such as boron or $BF_2$ can be employed. Boron or $BF_2$ can be implanted by ion implantation, diffusion, etc. to a needed concentration for the formation a p-type channel. Likewise, the active channel region 14 can be implanted by ion implantation, diffusion, etc. to implant species for an n-type channel, e.g., phosphorus or arsenic dopants.

A dummy gate oxide (not shown) is formed and a dummy gate layer is deposited over the dummy gate oxide. In a gate last process, dummy gates 12 are deposited over the substrate 8 and over the active channel region 16 on a CMOS region 20 of the device 10. Dummy gates 12 are concurrently deposited over the substrate 8 on a capacitor region 30 of the device 10. In one embodiment, the dummy gates 12 can include polysilicon or amorphous silicon. The dummy gates 12 may be deposited using a chemical vapor deposition (CVD) process or similar deposition process. The dummy gates 12 are patterned using a lithographic process, spacer image transfer (SIT) process, self-aligned double patterning process (SADP), self-aligned quadruple patterning process (SAQP), etc.

In a gate first process, metal gates or gate conductor 12 are deposited over the substrate 8 and over the active channel region 16 on a CMOS region 20 of the device 10. Gates 12 are concurrently deposited over the substrate 8 on a capacitor region 30 of the device 10. The gates 12 may include conductive materials, such as, e.g., doped polycrystalline or amorphous silicon, germanium, silicon germanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tungsten silicide, tungsten nitride, ruthenium oxide, cobalt silicide, nickel silicide), carbon nanotube, conductive carbon, graphene, or any suitable combination of these materials. The conductive material may further comprise dopants that are incorporated during or after deposition.

The gate structures 12 will be referred to as gates 12 hereafter and will include one of metal gates or dummy gates depending on the context.

Figure 2:
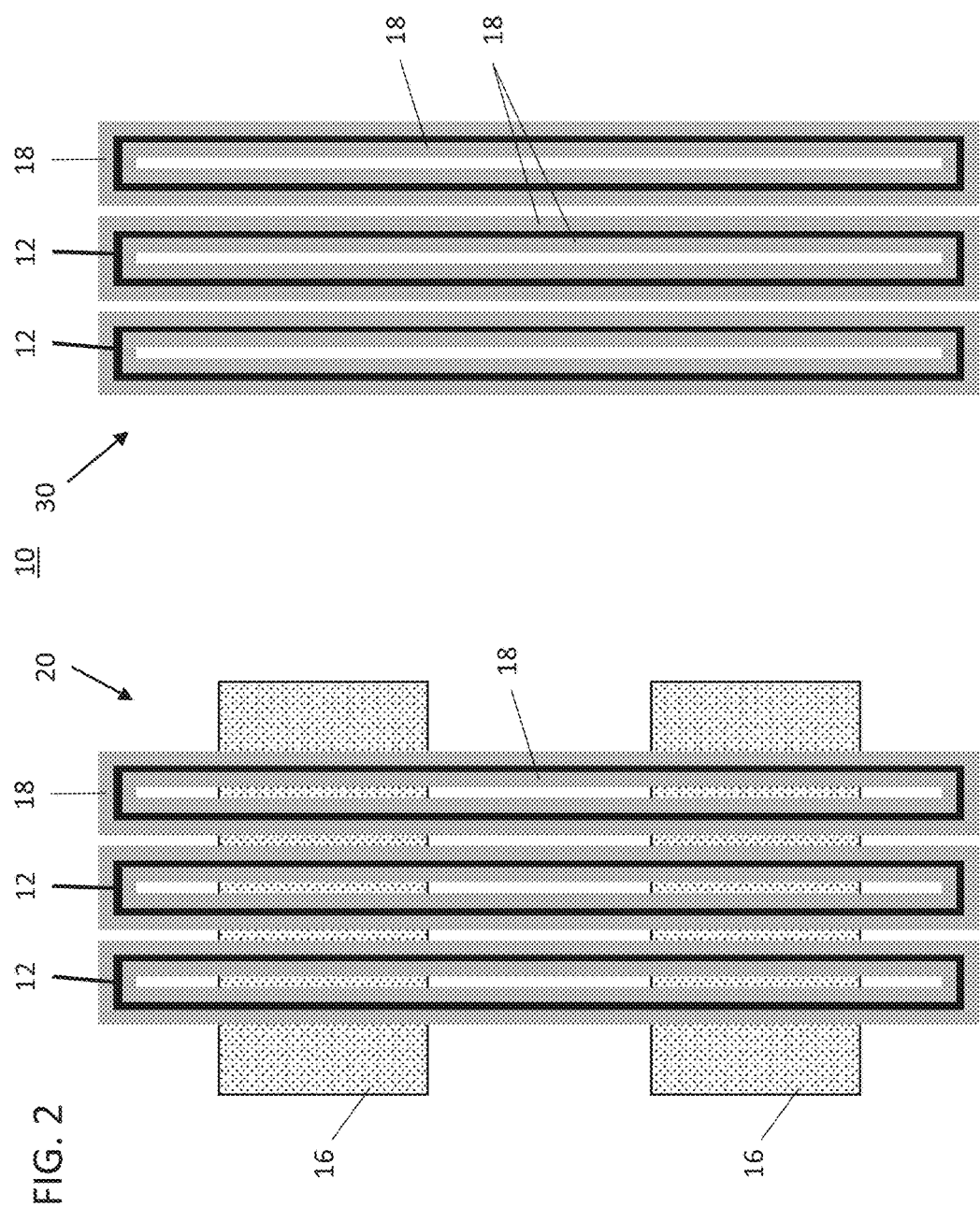
FIG. 2 is a top view showing the device of FIG. 1 having epitaxially grown source and drain regions formed in the CMOS region, spacers formed on the gates in the CMOS region and the capacitor region in accordance with an embodiment of the present invention.

Referring to FIG. 2, a gate sidewall spacer 18 may be formed in direct contact with the dummy gate 12. The gate sidewall spacer 18 can be formed by depositing a conformal layer of dielectric material, such as oxides, nitrides or oxynitrides, on the dummy gate 12 followed by an etch process (e.g., a reactive ion etch (RIE)) that removes the conformal layer from all of the horizontal surfaces (except for the sidewalls of the dummy gate 12). The gate sidewall spacer 18 may have a width ranging from 1 nm to 10 nm, and more particularly, ranging from about 1 nm to about 5 nm. Spacers 18 are formed concurrently in the CMOS region 20 and the capacitor region 30 of the device 10.

An epitaxial growth process is performed to epitaxially grow source and drain (S/D) regions 16 on the active channel regions 14. S/D epitaxy can be performed by ultrahigh vacuum chemical vapor deposition (UHVCVD), rapid thermal chemical vapor deposition (RTCVD), metalorganic chemical vapor deposition (MOCVD), low-pressure chemical vapor deposition (LPCVD), limited reaction processing CVD (LRPCVD), or molecular beam epitaxy (MBE). Epitaxial materials may be grown from gaseous or liquid precursors. Epitaxial materials may be grown using vapor-phase epitaxy (VPE), molecular-beam epitaxy (MBE), liquid-phase epitaxy (LPE), or other suitable process. Epitaxial silicon, silicon germanium (SiGe), and/or carbon doped silicon (Si:C) silicon can be doped during deposition (in-situ doped) by adding dopants, n-type dopants (e.g., phosphorus or arsenic) or p-type dopants (e.g., boron or gallium), depending on the type of transistor.

The terms "epitaxial growth and/or deposition" and "epitaxially formed and/or grown," mean the growth of a semiconductor material (crystalline material) on a deposition surface of another semiconductor material (crystalline material), in which the semiconductor material being grown (crystalline over layer) has substantially the same crystalline characteristics as the semiconductor material of the deposition surface (seed material). In an epitaxial deposition process, the chemical reactants provided by the source gases are controlled, and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a {100} orientated crystalline surface will take on a {100} orientation. In some embodiments, epitaxial growth and/or deposition processes are selective to forming on semiconductor surface, and generally do not deposit material on exposed surfaces, such as silicon dioxide or silicon nitride surfaces.

Figure 3:
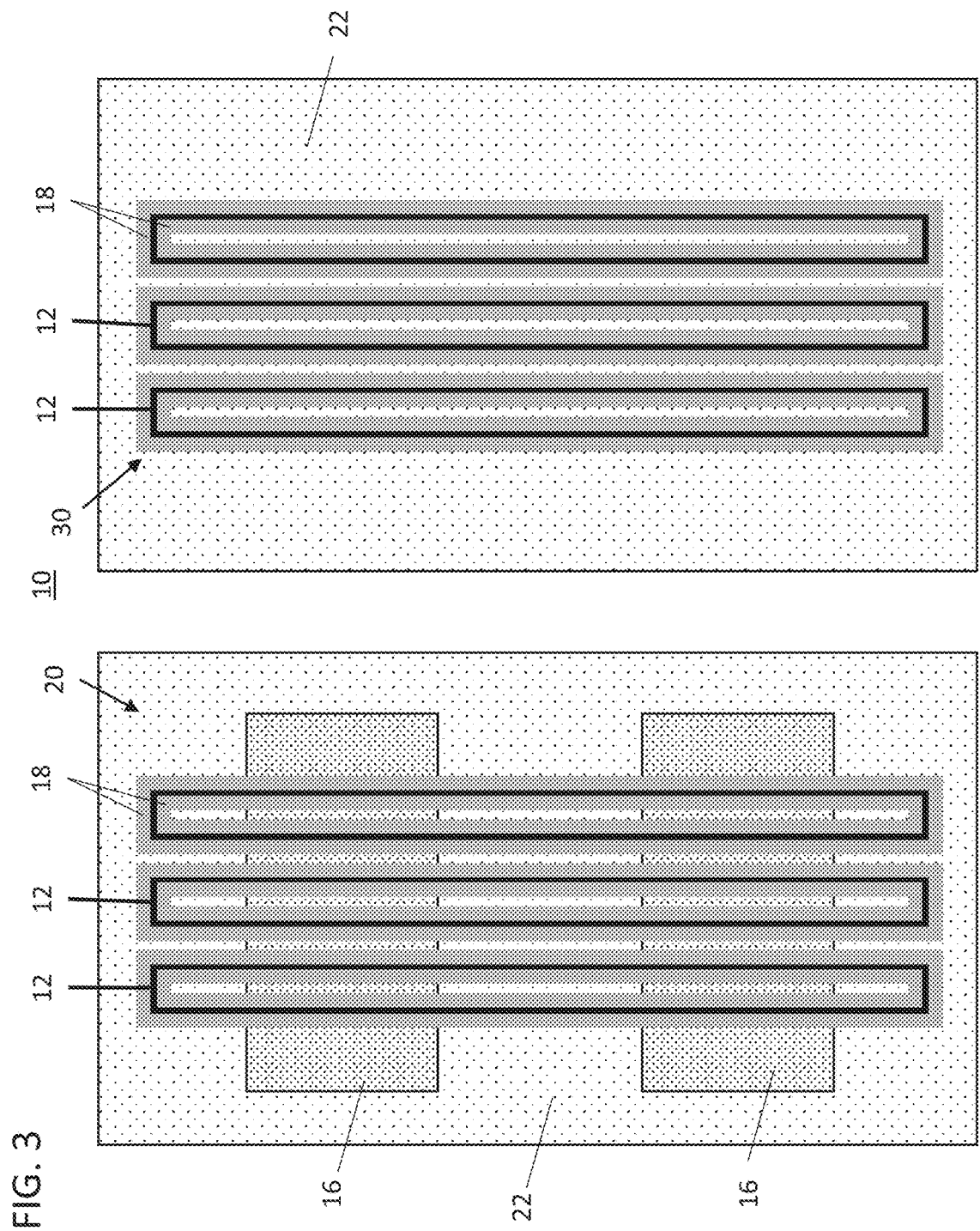
FIG. 3 is a top view showing a partially transparent interlevel dielectric layer formed on the device of FIG. 1 in the CMOS region and the capacitor region in accordance with an embodiment of the present invention.

Referring to FIG. 3, an interlevel dielectric (ILD) layer 22 is formed over the device 10 and covers all components in the CMOS region 20 and the capacitor region 30 of the device 10. The ILD 22 can include an oxide, a flowable oxide, a silicate glass, or other dielectric materials. The ILD 22 is then planarized to expose the gates 12. The planarization process can include a chemical mechanical polish (CMP). For illustration purposes, the S/D epitaxy region 16 remains visible through the ILD layer 22.

Figure 4:
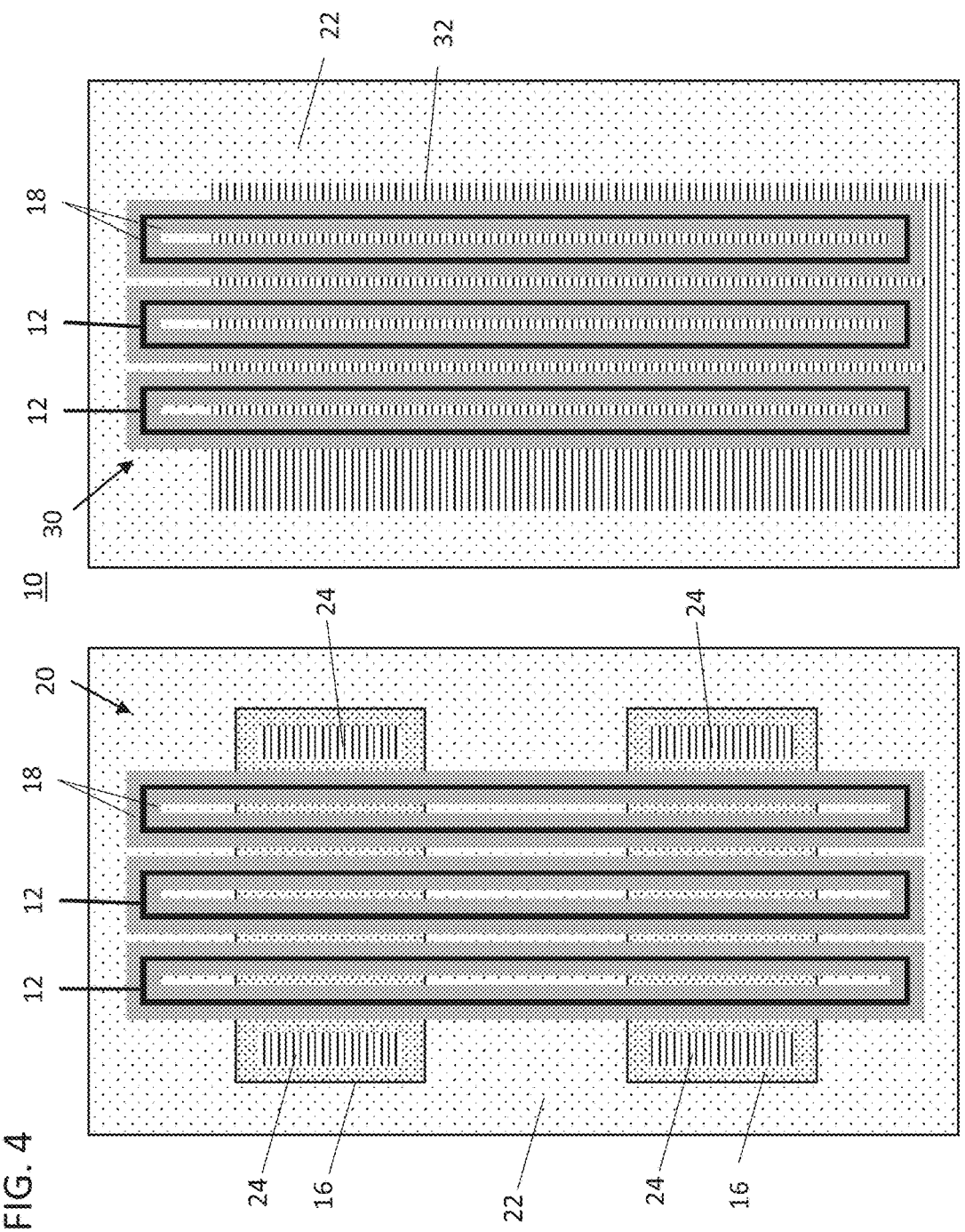
FIG. 4 is a top view of the device of FIG. 3 showing contacts formed through the interlevel dielectric layer in the CMOS region and a first capacitor electrode formed in the capacitor region in accordance with an embodiment of the present invention.

Referring to FIG. 4, the ILD layer 22 is patterned to form openings for contacts 24 in the CMOS region 20 and to form a contact metal region 32 in the capacitor region 30. A contact material is deposited to fill the holes and in planarized (e.g., CMP) to form contacts 24 and contact metal 32. The contact material can be deposited by a chemical vapor deposition process, evaporation, sputtering or any other suitable process.

The contacts 24 and 32 may include any suitable conductive material, such as polycrystalline or amorphous silicon, germanium, silicon germanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tungsten silicide, tungsten nitride, ruthenium oxide, cobalt silicide, nickel silicide), carbon nanotube, conductive carbon, graphene, or any suitable combination of these materials. The conductive material may further comprise dopants that are incorporated during or after deposition.

Figure 5:
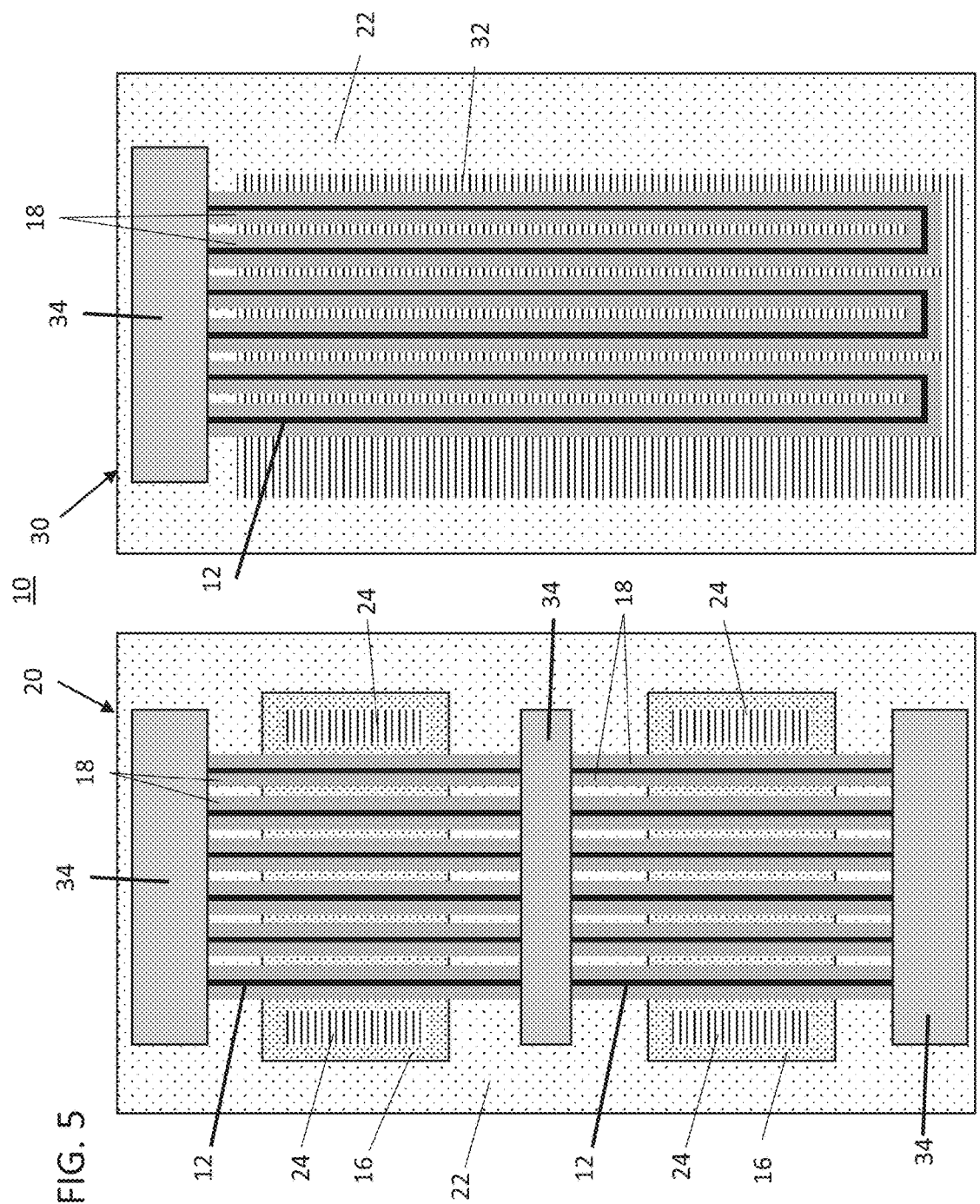
FIG. 5 is a top view of the device of FIG. 4 showing gate cut regions formed in the CMOS region and in the capacitor region in accordance with an embodiment of the present invention.

Referring to FIG. 5, a gate cut process is performed to cut the gates 12. The gate cut process includes forming gate cut regions 34 in the CMOS region 20 and in the capacitor region 30. Gate cut trenches are formed by depositing an etch mask material and patterning the etch mask material to expose portions of the gates 12 and spacers 18. In one embodiment, the gate cut trenches are formed in the CMOS regions 20 at the ends of the gates 12 and through a mid-span of the gates 12. In the capacitor region 30, the gate cut trenches include a trench at one end of the gates 12. The gate cut trench in the capacitor region 30 will be employed to join or form sections of the capacitor as will be described. The gate cut trenches are filled with a dielectric material and planarized (e.g., CMP) to form gate cut regions 34. The dielectric material for the gate cut regions 34 may include a nitride, an oxynitride or other suitable dielectric material.

Figure 6:
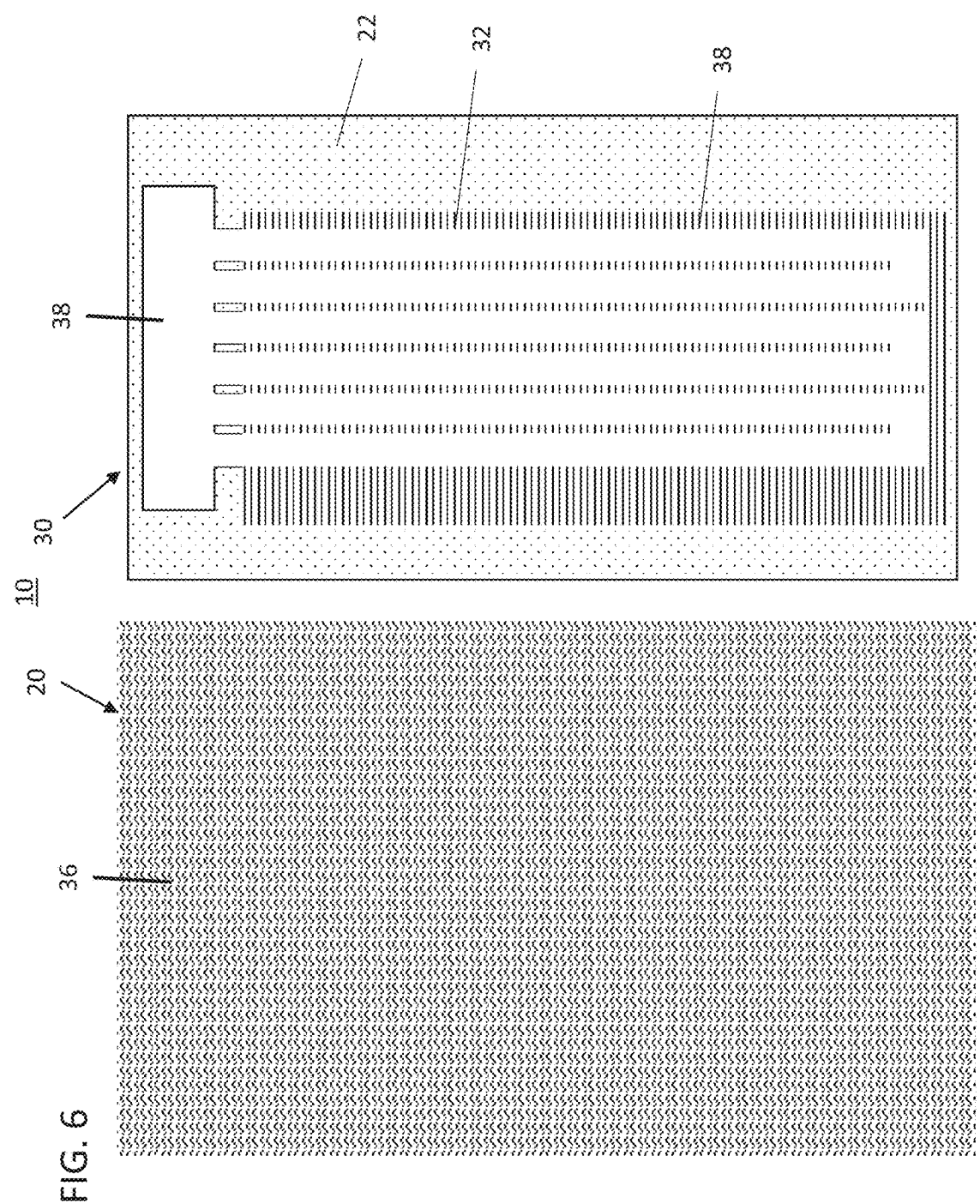
FIG. 6 is a top view of the device of FIG. 5 showing the CMOS region masked and the spacers and gate structures in the capacitor region removed in accordance with an embodiment of the present invention.

Referring to FIG. 6, a block mask 36 is formed over the device 10 and patterned to protect the CMOS region 20. The block mask 36 can include a resist material, a nitride or other suitable dielectric material. The capacitor region 30 is exposed and can now be subjected to one or more selective etching processes to remove the spacers 18, gates 12 and gate cut region 34 to form trenches 38.

A dielectric layer 40 (FIG. 7) is deposited in the trenches 38. The dielectric layer 40 will become or be part of a capacitor dielectric as will be described. The dielectric layer 40 can include a high-k dielectric. High-k denotes a dielectric material featuring a dielectric constant (k) higher than the dielectric constant of $SiO_2$. In one embodiment, the high-k dielectric material can include, for example, $HfO_2$, $ZrO_2$, $Al_2O_3$, $TiO_2$, $La_2O_3$, $SrTiO_3$, $LaAlO_3$, $Y_2O_3$ and mixtures thereof. Other examples of high-k dielectric materials for the at least one gate dielectric layer include hafnium silicate, hafnium silicon oxynitride or combinations thereof. In one embodiment, the high-k dielectric layer 40 can be deposited by chemical vapor deposition (CVD). The high-k dielectric layer 40 can be planarized (e.g., CMP).

Dielectric layer 40 is formed as a spacer along sidewalls of the trench 38 by performing a RIE to remove the dielectric layer 40 from the bottom of the trench 38. If a planarization process is not performed, the RIE can also be employed to remove the dielectric layer 40 from a top surface of the device 10 in the capacitor region 30. In one embodiment, the dielectric layer 40 or portion thereof can remain on a bottom surface of the trenches 38 in the capacitor region 30.

Figure 7:
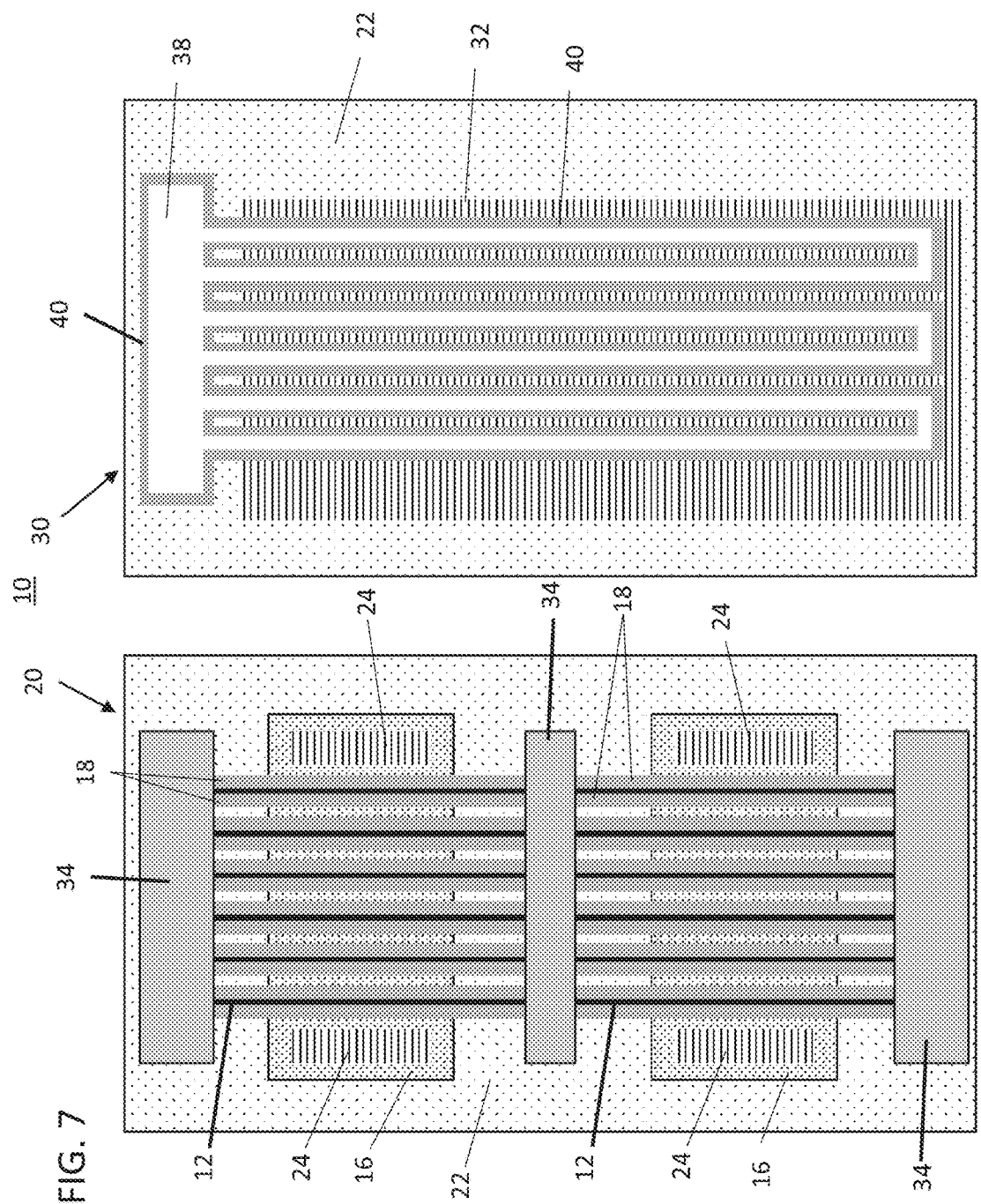
FIG. 7 is a top view of the device of FIG. 6 showing the CMOS region unmasked after the formation of a dielectric spacers in the capacitor region in accordance with an embodiment of the present invention.

Referring to FIG. 7, after the high-k dielectric layer 40 is processed like a spacer, the block mask 36 is removed from the CMOS region 20. FIG. 7 shows the high-k dielectric layer 40 formed in the trenches 38 on sidewalls thereof.

Figure 8:
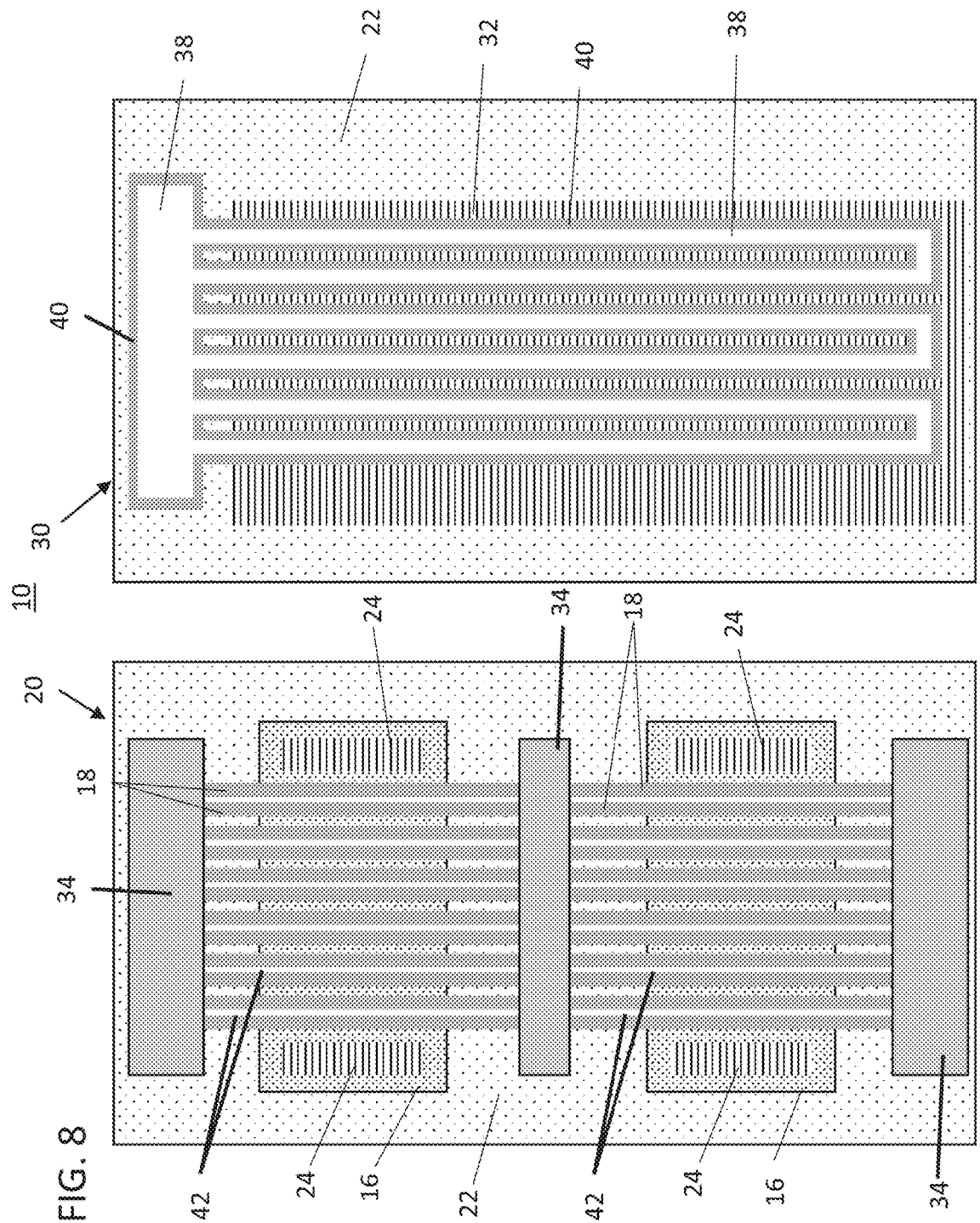
FIG. 8 is a top view of the device of FIG. 7 showing dummy gates removed from the CMOS region in accordance with an embodiment of the present invention.

Referring to FIG. 8, a selective etch is performed to remove the dummy gate 12 (and dummy oxide) from the CMOS region 20. This forms open regions 42. The open regions 42 expose the underlying epitaxy regions 16. If the gate 12 was formed as a metal gate previously, this step is skipped.

Figure 9:
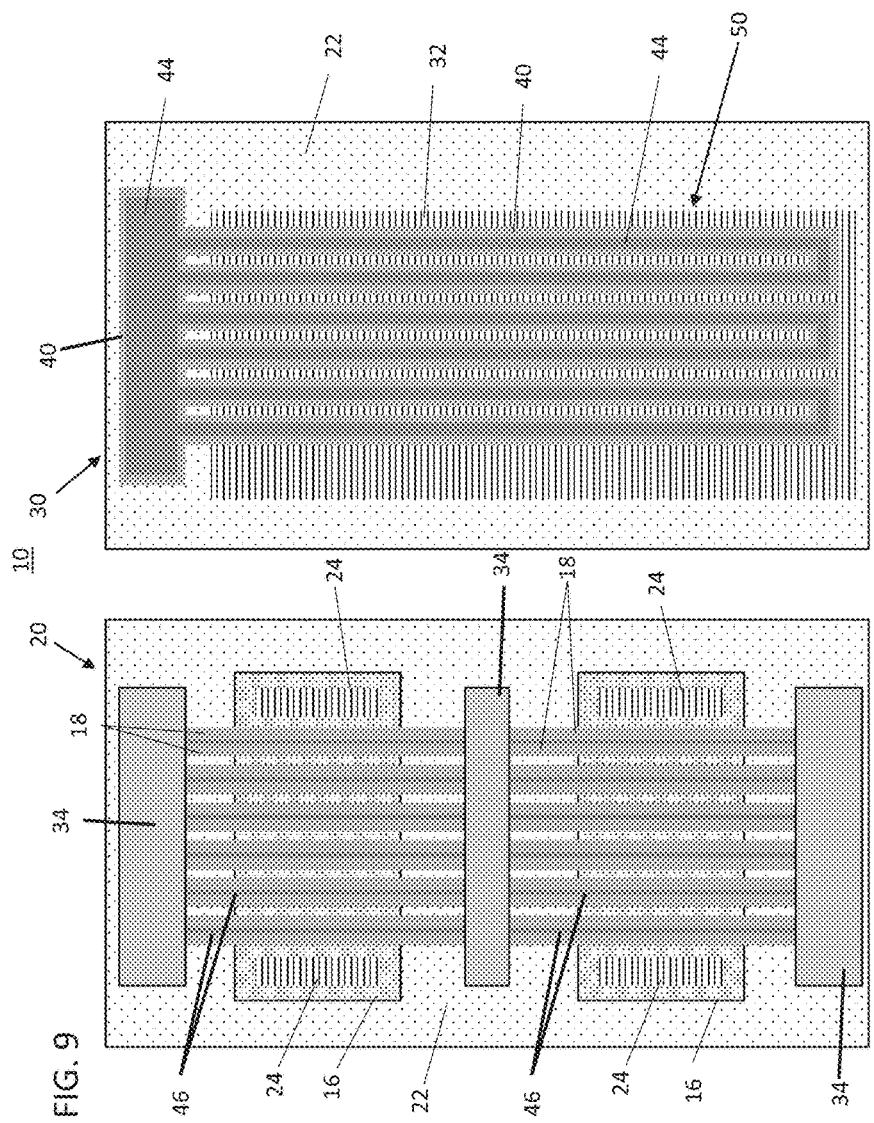
FIG. 9 is a top view of the device of FIG. 8 showing a gate metal formed in the CMOS region and a second capacitor electrode formed in the capacitor region in accordance with an embodiment of the present invention.

Referring to FIG. 9, a gate dielectric and a gate metal are deposited (or a capacitor metal if gates 12 where previously formed as metal gates). In one embodiment, a gate dielectric (not shown) is deposited in the trenches 42 (FIG. 8) and 38 followed by a gate metal 44 and 46. The gate dielectric may include a high-k oxide. The gate metal may include conductive materials, such as, e.g., doped polycrystalline or amorphous silicon, germanium, silicon germanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tungsten silicide, tungsten nitride, ruthenium oxide, cobalt silicide, nickel silicide), carbon nanotube, conductive carbon, graphene, or any suitable combination of these materials. The conductive material may further comprise dopants that are incorporated during or after deposition.

The gate metal forms gates 46 in the CMOS region 20 and an electrode 44 in capacitor region 30. In this way, CMOS devices are formed in the CMOS region concurrently with the formation of a metal-insulator-metal (MIM) capacitor 50. The capacitor 50 includes a gate metal 44 as one electrode, contact metal 32 as a second electrode and dielectric layer 40 as the insulator therebetween.

It should be understood that the gate conductors 46 may have been formed in a gate first process. In such an embodiment, the gate dielectric (optional) and the gate metal (44) would only be formed in the capacitor region 30 as the gate metal (46) would have been provided previously in the CMOS region 20.

Since the first and second electrodes 32, 44 are formed by different processes at different times, the electrodes 32, 44 may include the same or different materials. This provides additional flexibility in the design of the capacitor(s) 50.

Figure 10:
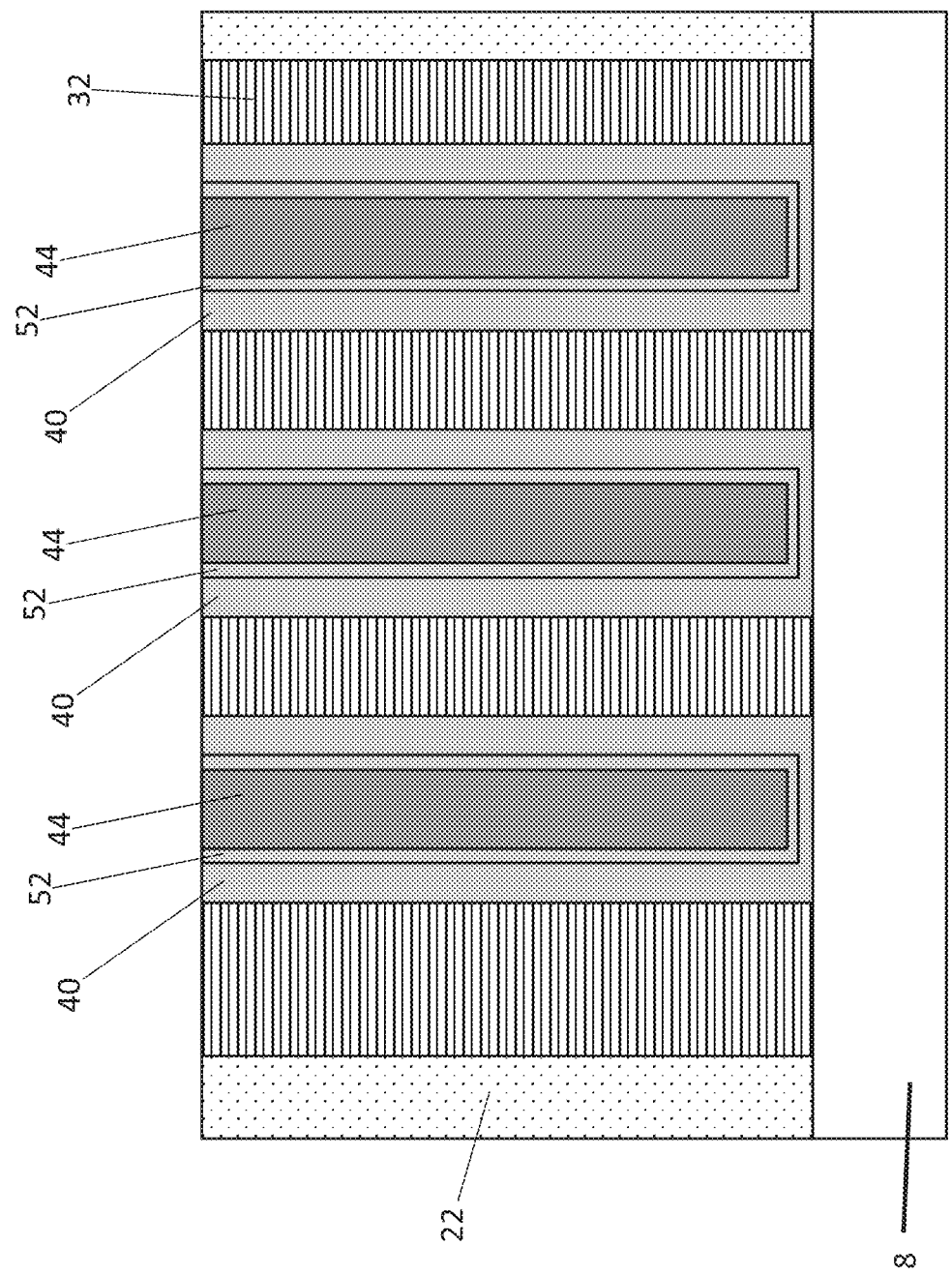
FIG. 10 is a cross-sectional view of the capacitor region in FIG. 9 showing a metal-insulator-metal (MIM) capacitor formed in the capacitor region in accordance with an embodiment of the present invention.

Referring to FIG. 10, a cross-sectional view of the MIM capacitor 50 is illustratively shown. In one embodiment, the gate metal that forms gates 46 in the CMOS region 20 is the same material concurrently formed as the electrode 44 in capacitor region 30. In addition, the contact metal that forms contacts 24 in the CMOS region 20 is the same material concurrently formed as the electrode 32 in capacitor region 30. Dielectric layer 40 is disposed between electrodes 32 and 44 and can be formed as the high-k oxide spacer and/or a gate dielectric 52 (e.g., high-k oxide) formed in the CMOS region 20. The dielectric material (40, 52) may or may not be present on the bottom of the trench.

It should be understood that the capacitance of the capacitor can be controlled or modified by controlling the size of the capacitor area, the number and size of the electrodes, the thickness and type of insulator material, etc. These features of the capacitor 50 can be controlled at the design stage or in-situ by altering the dimensions of the capacitor 50. For example, during the gate cut process the length of some of the longitudinal features can be cut. Other in-situ controls are also contemplated. In another example, the thickness of the insulator can be controlled by controlling one or both of the deposition processes for the dielectric layer 40 and/or gate dielectric 52.

Figure 11:
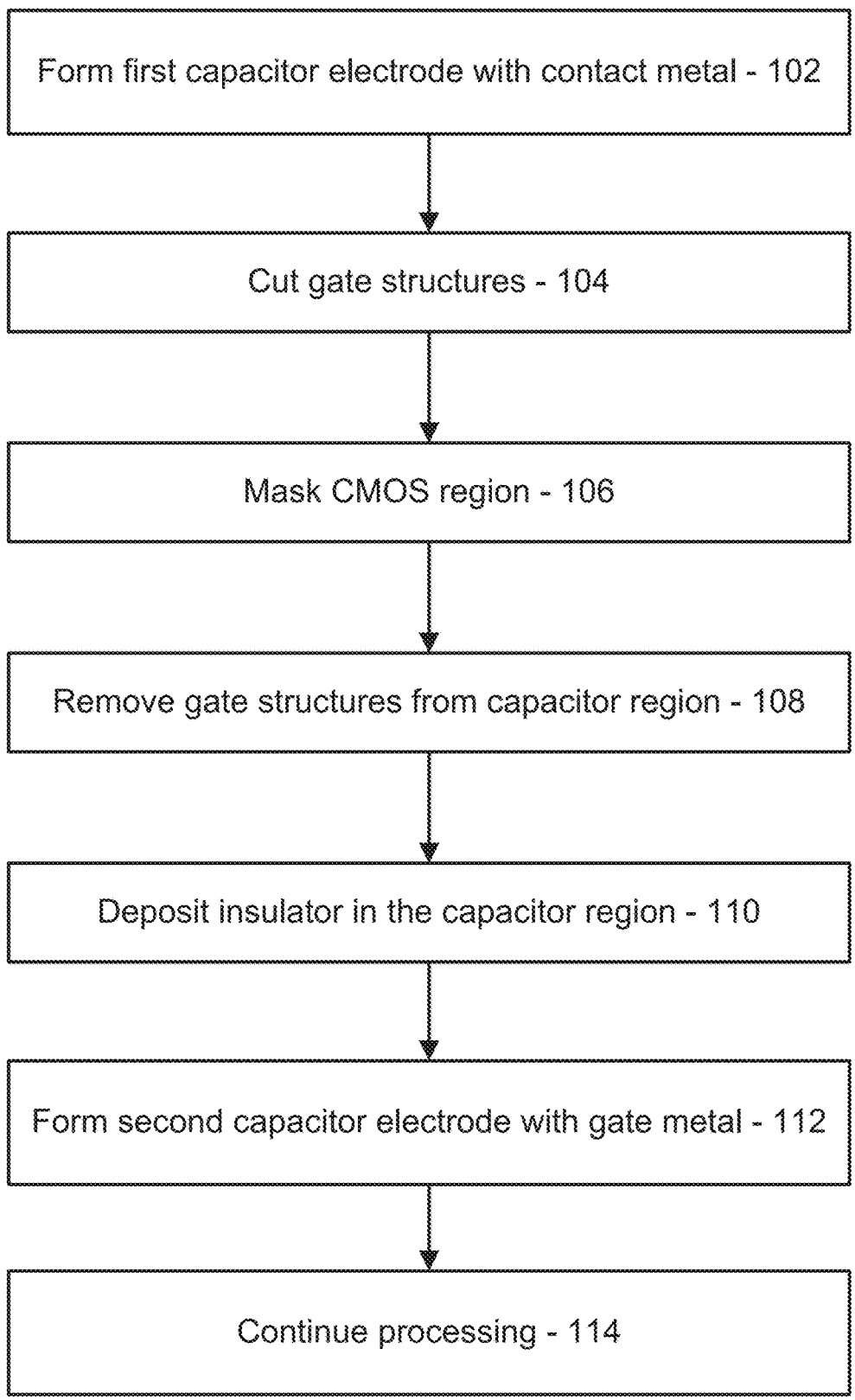
FIG. 11 is a block/flow diagram showing methods for forming an on-chip capacitor with CMOS devices in accordance with an embodiment of the present invention.

Referring to FIG. 11, methods for forming an on-chip capacitor with complementary metal oxide semiconductor (CMOS) devices are illustratively shown. In some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

In block 102, a first capacitor electrode is formed between gate structures in a capacitor region while forming contacts to source and drain (S/D) regions in a CMOS region. The CMOS region can include fin field effect transistors, planar transistors, etc. The gate structures can include a dummy gate and spacers, wherein depositing the gate metal to form the gate conductors in the CMOS region includes removing the dummy gate and replacing the dummy gate with the gate metal in subsequent processing.

In one embodiment, the gate structures can be concurrently formed as dummy gates in the CMOS region and the capacitor region. The gate structures can include sidewall spacers, which are concurrently formed on the dummy gates in the CMOS region and the capacitor region.

In block 104, gate structures are cut in the CMOS region and the capacitor region by etching at least one trench across the gate structures and filling the at least one trench with a dielectric material. The gate structures in the CMOS region may be cut at longitudinal end portions and/or midspan. A cut of the gate structures in the capacitor region can include cutting an end portion of the gate structures although a midspan (or intermediate) cut may also be employed.

In block 106, the CMOS region can be masked to process the capacitor region (e.g., remove the gate structures and the dielectric material in the at least one trench in a next step).

In block 108, the gate structures and the dielectric material in the at least one trench in the capacitor region are removed to form a position for an insulator and a second electrode.

In block 110, the insulator is deposited in the position. This may include the formation of a spacer in the position (e.g., in the at least one trench). The insulator can include a high-k oxide or other dielectric materials and can be formed in a conformal deposition process followed by a RIE and/or a CMP. The insulator can include a dielectric spacer and a gate dielectric layer, wherein the gate dielectric layer is employed in the CMOS regions in the gate structures.

In block 112, gate metal is deposited to form gate conductors in the CMOS region and the second electrode in the capacitor region. In block 114, processing continues to complete the device.

Having described preferred embodiments for an on-chip MIM capacitor (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for forming an on-chip capacitor with complementary metal oxide semiconductor (CMOS) devices, comprising:
    forming a first capacitor electrode between gate structures in a capacitor region while forming contacts to source and drain (S/D) regions in a CMOS region;
    cutting gate structures in the CMOS region and the capacitor region by etching at least one trench across the gate structures and filling the at least one trench with a dielectric material;
    removing the gate structures and the dielectric material in the at least one trench in the capacitor region to form a position for an insulator and a second electrode;
    depositing the insulator in the position; and
    depositing gate metal to form gate conductors in the CMOS region and the second electrode in the capacitor region.

2. The method as recited in claim 1, wherein the CMOS region includes fin field effect transistors.

3. The method as recited in claim 1, wherein the gate structures include a dummy gate and spacers, and wherein depositing the gate metal to form the gate conductors in the CMOS region includes removing the dummy gate and replacing the dummy gate with the gate metal.

4. The method as recited in claim 1, wherein cutting the gate structures in the CMOS region includes cutting the gate structures at longitudinal end portions and midspan.

5. The method as recited in claim 1, wherein depositing the insulator in the position includes depositing a dielectric spacer and a gate dielectric layer, wherein the gate dielectric layer is employed in the CMOS regions in the gate structures.

6. The method as recited in claim 1, further comprising masking the CMOS region to remove the gate structures and the dielectric material in the at least one trench.

7. The method as recited in claim 1, further comprising forming dummy gates for the gate structures in the CMOS region and the capacitor region, concurrently.

8. The method as recited in claim 7, further comprising forming sidewall spacers on the dummy gates for the gate structures in the CMOS region and the capacitor region, concurrently.

9. A method for forming an on-chip capacitor with complementary metal oxide semiconductor (CMOS) devices, comprising:
    patterning gate structures over source and drain (S/D) regions in a CMOS region and over a substrate in a capacitor region;
    planarizing an interlevel dielectric layer in the CMOS region and the capacitor region;
    depositing and planarizing contacts in contact holes to the S/D regions in the CMOS regions and between the gate structures in the capacitor region to form first electrode;
    cutting the gate structures in the CMOS region and the capacitor region by etching at least one trench across the gate structures and filling the at least one trench with a dielectric material;
    removing the gate structures and the dielectric material in the at least one trench in the capacitor region to form a position for an insulator and a second electrode;
    depositing the insulator in the position; and depositing gate metal to form gate conductors in the CMOS region and the second electrode in the capacitor region.

10. The method as recited in claim 9, wherein the CMOS region includes fin field effect transistors.

11. The method as recited in claim 9, wherein the gate structures include a dummy gate and spacers, and wherein depositing the gate metal to form the gate conductors in the CMOS region includes removing the dummy gate and replacing the dummy gate with the gate metal.

12. The method as recited in claim 9, wherein cutting the gate structures in the CMOS region includes cutting the gate structures at longitudinal end portions and midspan.

13. The method as recited in claim 9, wherein depositing the insulator in the position includes depositing a dielectric spacer and a gate dielectric layer, wherein the gate dielectric layer is employed in the CMOS regions in the gate structures.

14. The method as recited in claim 9, further comprising masking the CMOS region to remove the gate structures and the dielectric material in the at least one trench.

15. The method as recited in claim 9, further comprising forming dummy gates for the gate structures in the CMOS region and the capacitor region, concurrently.

16. The method as recited in claim 9, further comprising forming sidewall spacers on the dummy gates for the gate structures in the CMOS region and the capacitor region, concurrently.

* * * * *